(12) United States Patent  
Pi et al.

(10) Patent No.: US 11,387,832 B2  
(45) Date of Patent: Jul. 12, 2022

(54) CIRCUIT FOR ELIMINATING CLOCK JITTER BASED ON RECONFIGURABLE MULTI-PHASE-LOCKED LOOPS

(71) Applicant: HEFEI NEWCOSEMI TECHNOLOGY CO., LTD, Hefei Anhui (CN)

(72) Inventors: Deyi Pi, Beijing (CN); Hui Zheng, Beijing (CN)

(73) Assignee: HEFEI NEWCOSEMI TECHNOLOGY CO., LTD

( * ) Notice: Subject to any disclaimer, the term of this patent is extended or adjusted under 35 U.S.C. 154(b) by 0 days.

(21) Appl. No.: 17/115,879

(22) Filed: Dec. 9, 2020

(65) Prior Publication Data

US 2021/0409026 A1    Dec. 30, 2021

(30) Foreign Application Priority Data

Jun. 29, 2020   (CN) .......................... 202010607190.9

(51) Int. Cl.
*H03L 7/07* (2006.01)
*H03L 7/16* (2006.01)
*H03L 7/081* (2006.01)

(52) U.S. Cl.
CPC ................ *H03L 7/07* (2013.01); *H03L 7/081* (2013.01); *H03L 7/16* (2013.01)

(58) Field of Classification Search
CPC ... H03L 7/01; H03L 7/07; H03L 7/081; H03L 7/0812; H03L 7/0814; H03L 7/16; H03L 7/24
USPC .......................... 375/376; 327/156, 162, 165
See application file for complete search history.

(56) References Cited

U.S. PATENT DOCUMENTS

| 6,111,712 A * | 8/2000 | Vishakhadatta .......... H03L 7/23 |
| 6,686,805 B2 * | 2/2004 | Cyrusian ............ G11B 20/1426 331/25 |
| 10,587,274 B2 * | 3/2020 | Pi ........................... H03L 7/102 |

\* cited by examiner

*Primary Examiner* — Hai L Nguyen
(74) *Attorney, Agent, or Firm* — The Belles Group, P.C.

(57) ABSTRACT

A circuit for eliminating clock jitter based on reconfigurable multi-phase-locked loops includes multiple phase-locked loops, a data selector and a signal synthesizer. In a case of generating a clock signal with low jitter, output signals of two phase-locked loops are adjusted to be the same in frequency and phase, and output signals of other phase-locked loops are adjusted to be different from each other in frequency. The data selector selects output signals, and the signal synthesizer is enabled to superimpose and then average the first and second selected output signals, so as to obtain a clock signal with jitter eliminated. In a case of generating multiple clock signals with different frequencies, output signals of the multiple phase-locked loops are adjusted to be different from each other in frequency, to obtain multiple clock signals with different frequencies through the data selector without enabling the signal synthesizer.

3 Claims, 3 Drawing Sheets

CIRCUIT FOR ELIMINATING CLOCK JITTER BASED ON RECONFIGURABLE MULTI-PHASE-LOCKED LOOPS

CROSS-REFERENCE TO RELATED APPLICATIONS

The present application claims priority to Chinese Patent Application No. 202010607190.9, titled "CIRCUIT FOR ELIMINATING CLOCK JITTER BASED ON RECONFIGURABLE MULTI-PHASE-LOCKED LOOPS", filed on Jun. 29, 2020 with the China National Intellectual Property Administration (CNIPA), which is incorporated herein by reference in its entirety.

FIELD OF THE INVENTION

The present disclosure relates to the technical field of electronic circuits, and in particular to a circuit for eliminating clock jitter based on reconfigurable multi-phase-locked loops.

BACKGROUND

With the continuous development of communication systems, a phase-locked loop has been widely used in communication systems to realize functions of timing synchronization, clock generation and driving of a communication network, and the phase-locked loop is an important component of the communication system. As an important performance index, a jitter specification of a phase-locked loop determines an accuracy of a clock signal.

In the conventional technology, in some cases, it is required to use multiple phase-locked loops to generate clock signals with different frequencies. However, in other cases, it is necessary to minimize the number of phase-locked loops, to avoid jitter of a clock signal, thereby ensuring an accuracy of the clock signal. How to give considerations to both the above cases is a technical problem to be solved urgently in the related field.

Therefore, those skilled in the art is required to provide a circuit for eliminating clock jitter that is simple and may be configured flexibly, to avoid jitter of a clock signal, thereby ensuring an accuracy of the clock signal.

BRIEF SUMMARY

A circuit for eliminating clock jitter based on reconfigurable multi-phase-locked loops is provided in the present disclosure, to avoid jitter of a clock signal, thereby ensuring an accuracy of the clock signal. Moreover, the circuit is simple and may be configured flexibly.

To achieve the above objects, technical solutions are provided in the present disclosure as follows.

A circuit for eliminating clock jitter based on reconfigurable multi-phase-locked loops, includes multiple phase-locked loops, a data selector and a signal synthesizer, in which: each of input terminals of the multiple phase-locked loops receives a reference clock signal, output terminals of the multiple phase-locked loops are connected to input terminals of the data selector respectively, and a first output terminal and a second output terminal of the data selector are connected to two input terminals of the signal synthesizer respectively; each of the phase-locked loops is configured to generate a corresponding clock signal based on the reference clock signal, where the generated clock signal serves as an output signal of the phase-locked loop; the data selector is configured to make a selection on the output signals of the phase-locked loops, where the selected signals serve as output signals of the data selector; in a case that a clock signal with low jitter is required to be generated, output signals of a first phase-locked loop and a second phase-locked loop are adjusted to be the same in frequency and phase, output signals of other phase-locked loops are adjusted to be different from each other in frequency, the data selector selects output signals to be outputted based on a requirement for the clock signal with low jitter, and the signal synthesizer is enabled to superimpose and then average a first output signal and a second output signal of the data selector, to obtain a clock signal with jitter eliminated; and in a case that multiple clock signals with different frequencies are required to be generated, output signals of the multiple phase-locked loops are adjusted to be different from each other in frequency, and the multiple clock signals with different frequencies are obtained through the data selector without enabling the signal synthesizer.

In an embodiment, the signal synthesizer includes a first PMOS transistor, a second PMOS transistor, a first NMOS transistor and a second NMOS transistor, in which: a source of the first PMOS transistor is connected to a voltage signal, a drain of the first PMOS transistor is connected to a drain of the first NMOS transistor, and a source of the first NMOS transistor is grounded; a gate of the first PMOS transistor is connected to a gate of the first NMOS transistor, a common terminal between the gate of the first PMOS transistor and the gate of the first NMOS transistor is connected to the first output terminal of the data selector; a source of the second PMOS transistor is connected to the voltage signal, a drain of the second PMOS transistor is connected to a drain of the second NMOS transistor, and a source of the second NMOS transistor is grounded; a gate of the second PMOS transistor is connected to a gate of the second NMOS transistor, a common terminal of the gate of the second PMOS transistor and the gate of the second NMOS transistor is connected to the second output terminal of the data selector; and the drain of the first PMOS transistor is connected to the drain of the second PMOS transistor, a common terminal between the drain of the first PMOS transistor and the drain of the second PMOS transistor serves as an output terminal of the signal synthesizer to output the clock signal with jitter eliminated.

In an embodiment, the signal synthesizer includes a third PMOS transistor, a fourth PMOS transistor, a third NMOS transistor, a fourth NMOS transistor, a first resistor, a second resistor, a third current source and a fourth current source, in which: a first terminal of the first resistor is connected to a first terminal of the second resistor, a second terminal of the first resistor is connected to a source of the third PMOS transistor and a source of the fourth PMOS transistor, and a second terminal of the second resistor is connected to a drain of the third NMOS transistor and a drain of the fourth NMOS transistor; a gate of third PMOS transistor is connected to a positive pole of the first output terminal of the data selector, and a gate of the third NMOS transistor is connected to a negative pole of the first output terminal of the data selector; a gate of fourth PMOS transistor is connected to a positive pole of the second output terminal of the data selector, and a gate of the fourth NMOS transistor is connected to a negative pole of the second output terminal of the data selector; the third current source is connected to a drain of the third PMOS transistor and a source of the third NMOS transistor and serves as a static bias current of the third PMOS transistor and the third NMOS transistor; the fourth current source is connected to a drain of the fourth PMOS transistor and a source of the fourth NMOS transistor and serves as a static bias current of the fourth PMOS transistor and the fourth NMOS transistor; and the second terminal of the first transistor serves as a positive pole of an output terminal of the signal synthesizer, and the second terminal of the second transistor serves as a negative pole of the output terminal of the signal synthesizer, to output the clock signal with jitter eliminated.

The circuit for eliminating clock jitter based on reconfigurable multi-phase-locked loops according to the present disclosure includes multiple phase-locked loops, a data selector and a signal synthesizer. In a case that a clock signal with low jitter is required to be generated, output signals of a first phase-locked loop and a second phase-locked loop are adjusted to be the same in frequency and phase, output signals of other phase-locked loops are adjusted to be different from each other in frequency, the data selector selects output signals to be outputted based on a requirement for the clock signal with low jitter, and the signal synthesizer is enabled to superimpose and then average a first output signal and a second output signal of the data selector, to obtain a clock signal with jitter eliminated; and in a case that multiple clock signals with different frequencies are required to be generated, output signals of the multiple phase-locked loops are adjusted to be different from each other in frequency, and the multiple clock signals with different frequencies are obtained through the data selector without enabling the signal synthesizer. The circuit for eliminating clock jitter according to the present disclosure may be implemented easily and configured flexibly to avoid jitter of a clock signal, thereby ensuring an accuracy of the clock signal.

BRIEF DESCRIPTION OF THE DRAWINGS

In order to more clearly illustrate the technical solutions in embodiments of the present disclosure or in the conventional technology, drawings to be used in the description of the embodiments of the present disclosure or the conventional technology are briefly introduced hereinafter. It is apparent that the drawings described below show merely some embodiments of the present disclosure, and other drawings may be obtained by those skilled in the art based on the provided drawings without any creative effort.

DETAILED DESCRIPTION

A circuit for eliminating clock jitter based on reconfigurable multi-phase-locked loops is provided in the present disclosure, to realize functions of timing synchronization, clock generation and driving of a communication network.

An object of the present disclosure is to provide a circuit for eliminating clock jitter based on reconfigurable multi-phase-locked loops that is simple and may be configured flexibly, to avoid jitter of a clock signal, thereby ensuring an accuracy of the clock signal.

Technical solutions in embodiments of the present disclosure are clearly and completely described below in conjunction with the drawings of the embodiments of the present disclosure. Apparently, the embodiments described in the following are only some embodiments of the present disclosure, rather than all the embodiments. Any other embodiments obtained by those skilled in the art based on the embodiments in the present disclosure without any creative effort fall within the protection scope of the present disclosure.

In order to make the above objects, features and advantages of the present disclosure clear and easy to be understood, embodiments of the present disclosure are described in detail below in conjunction with the drawings.

Figure 1:
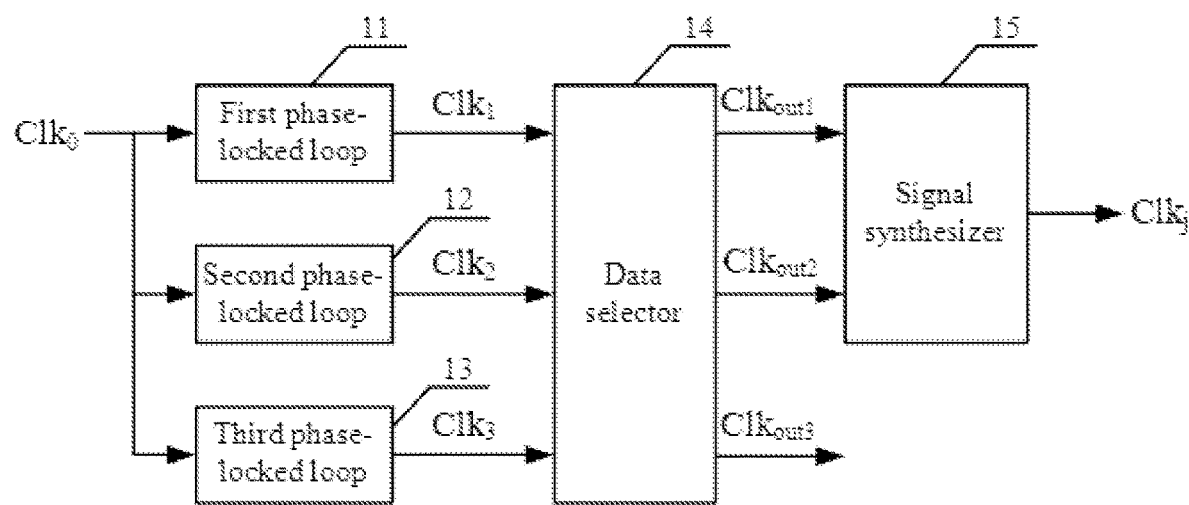
FIG. 1 is a schematic structural diagram of a circuit for eliminating clock jitter based on reconfigurable multi-phase-locked loops according to an embodiment of the present disclosure.

Reference is made to FIG. 1, which is a schematic structural diagram of a circuit for eliminating clock jitter based on reconfigurable multi-phase-locked loops according to an embodiment of the present disclosure.

In the technical solution disclosed in the embodiments of the present disclosure, the principle of the present disclosure is illustrated by taking three phase-locked loops as an example. As shown in FIG. 1, the circuit for eliminating clock jitter includes a first phase-locked loop 11, a second phase-locked loop 12, a third phase-locked loop 13, a data selector 14 and a signal synthesizer 15.

An input terminal of the first phase-locked loop 11, an input terminal of the second phase-locked loop 12 and an input terminal of the third phase-locked loop 13 each receives a reference clock signal $Clk_0$, and generate, based on the reference clock signal $Clk_0$, three clock signals respectively, which are a first clock signal $Clk_1$, a second clock signal $Clk_2$ and a third clock signal $Clk_3$.

Three input terminals of the data selector 14 are connected to an output terminal of the first phase-locked loop 11, an output terminal of the second phase-locked loop 12 and an output terminal of the third phase-locked loop 13 respectively, to make a selection on output signals of the first phase-locked loop 11, the second phase-locked loop 12 and the third phase-locked loop 13, and the selected signal serves as an output signal of the data selector 14. A first output terminal of the data selector 14 corresponds to the first phase-locked loop 11, a second output terminal of the data selector 14 corresponds to the second phase-locked loop 12, and a third output terminal of the data selector 14 corresponds to the third phase-locked loop 13.

Two input terminals of the signal synthesizer 15 are connected to the first output terminal and the second output terminal of the data selector 14 respectively, to superimpose and then average a first output signal $Clk_{out1}$ and a second output signal $Clk_{out2}$ of the data selector 14, so as to output a clock signal $Clk_3$ with jitter eliminated.

In a case that multiple clock signals are required to be generated, the first clock signal $Clk_1$, the second clock signal $Clk_2$ and the third clock signal $Clk_3$ respectively outputted by the first phase-locked loop 11, the second phase-locked loop 12 and the third phase-locked loop 13 are adjusted to be different from each other in frequency. A first output clock signal $Clk_{out1}$, a second output clock signal $Clk_{out2}$, and a third output clock signal $Clk_{out3}$ different from each other in frequency are obtained directly through the data selector 14 without enabling the signal synthesizer 15.

In a case that a clock signal with low jitter is required to be generated, the first clock signal $Clk_1$ and the second clock signal $Clk_2$ respectively outputted by the first phase-locked loop 11 and the second phase-locked loop 12 are adjusted to be the same in frequency and phase. The third clock signal $Clk_3$ outputted by the third phase-locked loop 13 is adjusted to be different in frequency from the first clock signal $Clk_1$ and the second clock signal $Clk_2$ respectively outputted by the first phase-locked loop 11 and the second phase-locked loop 12. The signal synthesizer 15 is enabled, so as to obtain a clock signal $Clk_3$ with jitter eliminated through the signal synthesizer 15.

It should be noted that, in the embodiment of the present disclosure, it is assumed that $T_0$ represents an ideal time position of an edge of a desired clock signal with low jitter, and actually, a time position $T_1$ of an edge of the first output signal $Clk_{out1}$ of the data selector 14 is expressed as $T_1=T_0+N_1$, where $N_1$ represents phase jitter, and a time position $T_2$ of an edge of the second output signal $Clk_{out2}$ of the data selector 14 is expressed as $T_2=T_0+N_2$, where $N_2$ represents phase jitter, then a time position $T_3$ of an edge of the output clock signal $Clk_j$ of the signal synthesizer 15 is expressed as $T_3=T_0+(N_1+N_2)/2$. If a root-mean-square (RMS) value of phase jitter of each of the first output signal $Clk_{out1}$ and the second output signal $Clk_{out2}$ of the data selector 14 is expressed as $\Delta$, then the RMS value of phase jitter of the output clock signal $Clk_j$ of the signal synthesizer 15 is expressed as $\Delta/\sqrt{2}$, which indicates that the phase jitter drops by 3 dB.

The circuit for eliminating clock jitter based on reconfigurable multi-phase-locked loops according to the present disclosure includes multiple phase-locked loops, a data selector and a signal synthesizer. In a case that a clock signal with low jitter is required to be generated, output signals of a first phase-locked loop and a second phase-locked loop are adjusted to be the same in frequency and phase, output signals of other phase-locked loops are adjusted to be different from each other in frequency, the data selector selects output signals to be outputted based on a requirement for the clock signal with low jitter, and the signal synthesizer is enabled to superimpose and then average a first output signal and a second output signal of the data selector, to obtain a clock signal with jitter eliminated; and in a case that multiple clock signals with different frequencies are required to be generated, output signals of the multiple phase-locked loops are adjusted to be different from each other in frequency, and the multiple clock signals with different frequencies are obtained through the data selector without enabling the signal synthesizer. The circuit for eliminating clock jitter according to the present disclosure may be implemented easily and configured flexibly to avoid jitter of a clock signal, thereby ensuring an accuracy of the clock signal.

In an embodiment of the present disclosure, a structure of the signal synthesizer 15 may be determined based on user requirements. For example, the structure of the signal synthesizer 15 may be as shown in FIG. 2 and FIG. 3.

Figure 2:
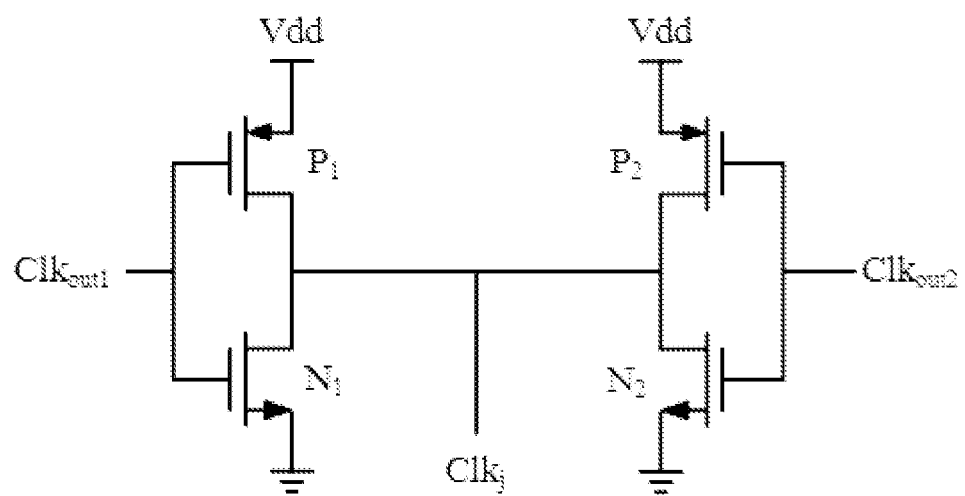
FIG. 2 is a schematic structural diagram of a signal synthesizer according to an embodiment of the present disclosure.

Referring to FIG. 2, in the embodiment of the present disclosure, the signal synthesizer 15 may include a first positive channel metal oxide semiconductor (PMOS) transistor $P_1$, a second PMOS transistor $P_2$, a first N metal oxide semiconductor (NMOS) transistor $N_1$ and a second NMOS transistor $N_2$.

A source of the first PMOS transistor $P_1$ is connected to a voltage signal Vdd, a drain of the first PMOS transistor $P_1$ is connected to a drain of the first NMOS transistor $N_1$, and a source of the first NMOS transistor $N_1$ is grounded. A gate of the first PMOS transistor $P_1$ is connected to a gate of the first NMOS transistor $N_1$, a common terminal between the gate of the first PMOS transistor $P_1$ and the gate of the first NMOS transistor $N_1$ are both connected to the first output terminal of the data selector 14. A source of the second PMOS transistor $P_2$ is connected to the Vdd, a drain of the second PMOS transistor $P_2$ is connected to a drain of the second NMOS transistor $N_2$, and a source of the second NMOS transistor $N_2$ is grounded. A gate of the second PMOS transistor $P_2$ is connected to a gate of the second NMOS transistor $N_2$, and a common terminal between the gate of the second PMOS transistor $P_2$ and the gate of the second NMOS transistor $N_2$ is connected to the second output terminal of the data selector 14. The drain of the first PMOS transistor $P_1$ is connected to the drain of the second PMOS transistor $P_2$, and a common terminal between the drain of the first PMOS transistor $P_1$ and the drain of the second PMOS transistor $P_2$ serves as an output terminal of the signal synthesizer 15, to output the clock signal $Clk_3$ with jitter eliminated.

Figure 3:
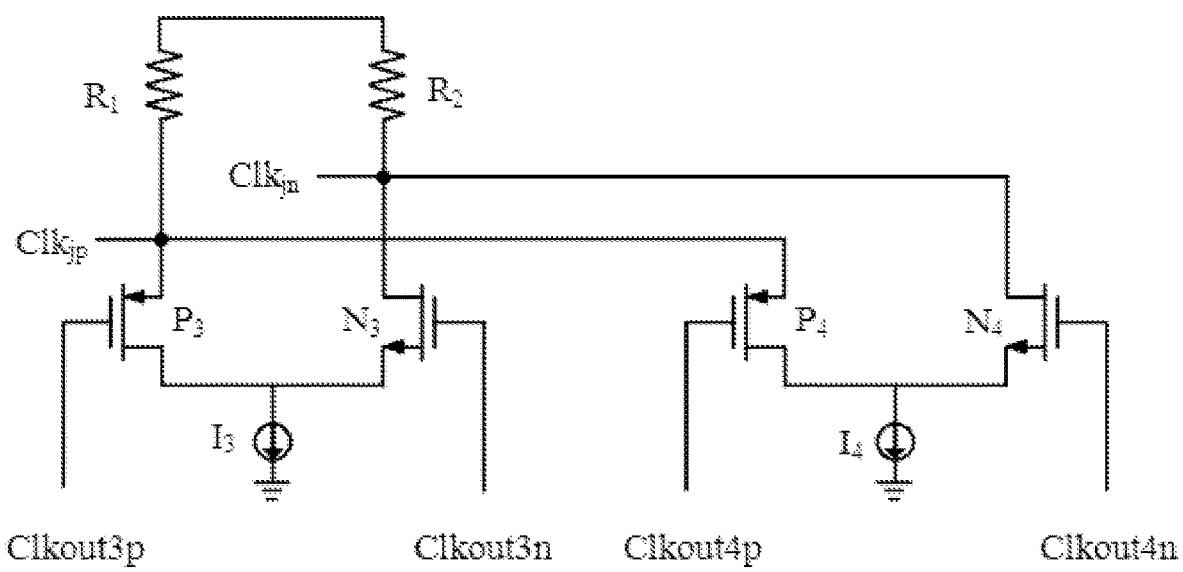
FIG. 3 is a schematic structural diagram of a signal synthesizer according to another embodiment of the present disclosure.

Referring to FIG. 3, in the embodiment of the present disclosure, the signal synthesizer 15 may include a third PMOS transistor $P_3$, a fourth PMOS transistor $P_4$, a third NMOS transistor $N_3$, a fourth NMOS transistor $N_4$, a first resistor $R_1$, a second resistor $R_2$, a third current source $I_3$ and a fourth source $I_4$.

A first terminal of the first resistor $R_1$ is connected to a first terminal of the second resistor $R_2$, a second terminal of the first resistor $R_1$ is connected to a source of the third PMOS transistor $P_3$ and a source of the fourth PMOS transistor $P_4$, and a second terminal of the second resistor $R_2$ is connected to a drain of the third NMOS transistor $N_3$ and a drain of the fourth NMOS transistor $N_4$. A gate of third PMOS transistor $P_3$ is connected to a positive pole of the first output terminal of the data selector 14, and a gate of the third NMOS transistor $N_3$ is connected to a negative pole of the first output terminal of the data selector 14. A gate of the fourth PMOS transistor $P_4$ is connected to a positive pole of the second output terminal of the data selector 14, and a gate of the fourth NMOS transistor $N_4$ is connected to a negative pole of the second output terminal of the data selector 14. The third current source $I_3$ is connected to a drain of the third PMOS transistor $P_3$ and a source of the third NMOS transistor $N_3$ and serves as a static bias current of the third PMOS transistor $P_3$ and the third NMOS transistor $N_3$. The fourth current source $I_4$ is connected to a drain of the fourth PMOS transistor $P_4$ and a source of the fourth NMOS transistor $N_4$ and serves as a static bias current of the fourth PMOS transistor $P_4$ and the fourth NMOS transistor $N_4$. The second terminal of the first transistor $R_1$ serves as a positive pole of the output terminal of the signal synthesizer 15, and the second terminal of the second transistor $R_2$ serves as a negative pole of the output terminal of the signal synthesizer 15, to output the clock signal $Clk_j$ with jitter eliminated.

The various embodiments in this specification are described in a progressive manner. Each embodiment focuses on the differences from other embodiments, and the same or similar parts between the various embodiments may be referred to each other. For the device disclosed in the embodiment, since it corresponds to the method disclosed in the embodiment, the description thereof is relatively simple, and the relevant parts may be referred to the description in the method part.

With the description of the embodiments disclosed above, those skilled in the art may implement or use technical solutions of the present disclosure. Various modifications to the embodiments are apparent to those skilled in the art, and the general principles defined herein may be implemented in other embodiments without departing from the spirit or scope of the present disclosure. Therefore, the present disclosure may not be limited to the embodiments described herein, but should comply with the widest scope consistent with the principles and novel features disclosed herein.

It should be noted that, terms "include", "comprise" or any other variants are intended to be non-exclusive. Therefore, a process, method, article or device including multiple elements includes not only the elements but also other elements that are not enumerated, or also include the elements inherent for the process, method, article or device. Unless expressively limited otherwise, the statement "comprising (including) a . . . " does not exclude other similar elements that may exist in the process, method, article or device including the elements.

In view of the above, those skilled in the art should understand that though multiple exemplary embodiments of the present disclosure are shown and described in detail in this specification, many other variants or modifications conforming to the principle of the present disclosure may be directly determined or derived based on contents of the present disclosure without departing from the spirit and the scope of the present disclosure. Therefore, the scope of the present disclosure should be understood and deemed to cover all other variants or modifications.

What is claimed is:

1. A circuit for eliminating clock jitter based on reconfigurable multi-phase-locked loops, comprising a plurality of phase-locked loops, a data selector and a signal synthesizer, wherein:
    each of input terminals of the plurality of phase-locked loops receives a reference clock signal, output terminals of the plurality of phase-locked loops are connected to input terminals of the data selector respectively, and a first output terminal and a second output terminal of the data selector are connected to two input terminals of the signal synthesizer respectively;
    each of the phase-locked loops is configured to generate a corresponding clock signal based on the reference clock signal, wherein the generated clock signal serves as an output signal of the phase-locked loop;
    the data selector is configured to make a selection on the output signals of the phase-locked loops, wherein the selected signals serve as output signals of the data selector;
    in a case that a clock signal with low jitter is required to be generated, output signals of a first phase-locked loop and a second phase-locked loop are adjusted to be the same in frequency and phase, output signals of other phase-locked loops are adjusted to be different from each other in frequency, the data selector selects output signals to be outputted based on a requirement for the clock signal with low jitter, and the signal synthesizer is enabled to superimpose and then average a first output signal and a second output signal of the data selector, to obtain a clock signal with jitter eliminated; and
    in a case that a plurality of clock signals with different frequencies are required to be generated, output signals of the plurality of phase-locked loops are adjusted to be different from each other in frequency, and the plurality of clock signals with different frequencies are obtained through the data selector without enabling the signal synthesizer.

2. The circuit for eliminating clock jitter according to claim 1, wherein the signal synthesizer comprises a first PMOS transistor, a second PMOS transistor, a first NMOS transistor and a second NMOS transistor, wherein:
    a source of the first PMOS transistor is connected to a voltage signal, a drain of the first PMOS transistor is connected to a drain of the first NMOS transistor, and a source of the first NMOS transistor is grounded;
    a gate of the first PMOS transistor is connected to a gate of the first NMOS transistor, a common terminal between the gate of the first PMOS transistor and the gate of the first NMOS transistor is connected to the first output terminal of the data selector;
    a source of the second PMOS transistor is connected to the voltage signal, a drain of the second PMOS transistor is connected to a drain of the second NMOS transistor, and a source of the second NMOS transistor is grounded;
    a gate of the second PMOS transistor is connected to a gate of the second NMOS transistor, a common terminal between the gate of the second PMOS transistor and the gate of the second NMOS transistor is connected to the second output terminal of the data selector; and
    the drain of the first PMOS transistor is connected to the drain of the second PMOS transistor, a common terminal between the drain of the first PMOS transistor and the drain of the second PMOS transistor serves as an output terminal of the signal synthesizer to output the clock signal with jitter eliminated.

3. The circuit for eliminating clock jitter according to claim 1, wherein the signal synthesizer comprises a third PMOS transistor, a fourth PMOS transistor, a third NMOS transistor, a fourth NMOS transistor, a first resistor, a second resistor, a third current source and a fourth current source, and wherein:
    a first terminal of the first resistor is connected to a first terminal of the second resistor, a second terminal of the first resistor is connected to a source of the third PMOS transistor and a source of the fourth PMOS transistor, and a second terminal of the second resistor is connected to a drain of the third NMOS transistor and a drain of the fourth NMOS transistor;
    a gate of third PMOS transistor is connected to a positive pole of the first output terminal of the data selector, and a gate of the third NMOS transistor is connected to a negative pole of the first output terminal of the data selector;
    a gate of fourth PMOS transistor is connected to a positive pole of the second output terminal of the data selector, and a gate of the fourth NMOS transistor is connected to a negative pole of the second output terminal of the data selector;
    the third current source is connected to a drain of the third PMOS transistor and a source of the third NMOS transistor and serves as a static bias current of the third PMOS transistor and the third NMOS transistor;
    the fourth current source is connected to a drain of the fourth PMOS transistor and a source of the fourth NMOS transistor and serves as a static bias current of the fourth PMOS transistor and the fourth NMOS transistor; and
    the second terminal of the first transistor serves as a positive pole of an output terminal of the signal synthesizer, and the second terminal of the second transistor serves as a negative pole of the output terminal of the signal synthesizer, to output the clock signal with jitter eliminated.

* * * * *